(12) United States Patent
Inamasa

(10) Patent No.: US 12,300,976 B2
(45) Date of Patent: May 13, 2025

(54) WIND PRESSURE TYPE SHUTTER FOR OUTDOOR SWITCHBOARD

(71) Applicant: TMEIC Corporation, Chuo-ku (JP)

(72) Inventor: Keisuke Inamasa, Tokyo (JP)

(73) Assignee: TMEIC Corporation, Chuo-ku (JP)

( * ) Notice: Subject to any disclaimer, the term of this patent is extended or adjusted under 35 U.S.C. 154(b) by 0 days.

(21) Appl. No.: 18/251,024

(22) PCT Filed: Oct. 22, 2021

(86) PCT No.: PCT/JP2021/039125
§ 371 (c)(1),
(2) Date: Apr. 28, 2023

(87) PCT Pub. No.: WO2023/067804
PCT Pub. Date: Apr. 27, 2023

(65) Prior Publication Data
US 2024/0332919 A1 Oct. 3, 2024

(51) Int. Cl.
*H02B 1/56* (2006.01)
*F04D 25/14* (2006.01)
(Continued)

(52) U.S. Cl.
CPC ............... *H02B 1/14* (2013.01); *F04D 25/14* (2013.01); *H02B 1/56* (2013.01); *H05K 5/0214* (2022.08); *H05K 7/20181* (2013.01)

(58) Field of Classification Search
CPC .. H05K 7/20181; H05K 5/0214; F04D 25/14; F24F 13/14; F24F 13/1406; F24F 13/1413; F16K 1/16; F16K 1/165
See application file for complete search history.

(56) References Cited

U.S. PATENT DOCUMENTS 1,532,635 A * 4/1925 Osbun ..................... F04D 25/14
454/352
3,286,732 A * 11/1966 Alley ....................... F24F 13/15
137/601.11
(Continued)

FOREIGN PATENT DOCUMENTS

GB          485850 A  *  5/1938  ............. F04D 25/14
JP     2017-200298 A     11/2017

OTHER PUBLICATIONS

International Search Report (with English translation) and Written Opinion mailed on Dec. 7, 2021 in PCT/JP2021/039125 filed on Oct. 22, 2021 therein, 10 pages.

*Primary Examiner* — Robert J Hoffberg
(74) *Attorney, Agent, or Firm* — Oblon, McClelland, Maier & Neustadt, L.L.P.

(57) ABSTRACT

A wind pressure type shutter includes first and second rotation shafts, and first and second flaps. The first flap rotatably hung on the first rotation shaft closes a flow path in a vertical position and opens the flow path in a position rotated from the vertical position. The second flap rotatably attached to the second rotation shaft closes the flow path and prevents the rotation of the first flap by an upstream-side end portion of the second flap in a horizontal position, and opens the flow path in a position rotated from the horizontal position. When a negative pressure is generated downstream of the second flap, the second flap rotates to open the flow path and the upstream-side end portion is disengaged from the first flap, so that the first flap rotates toward a downstream side to open the flow path.

20 Claims, 9 Drawing Sheets

(51) Int. Cl.
*H02B 1/14* (2006.01)
*H05K 5/02* (2006.01)
*H05K 7/20* (2006.01)

(56) References Cited

U.S. PATENT DOCUMENTS

| | | | | |
|---|---|---|---|---|
| 4,766,807 | A * | 8/1988 | Davis | F24F 13/1406 |
| | | | | 454/333 |
| 6,181,557 | B1 * | 1/2001 | Gatti | H05K 7/20618 |
| | | | | 361/679.48 |
| 8,899,066 | B2 * | 12/2014 | Mahajan | F24F 1/14 |
| | | | | 62/408 |
| 11,252,846 | B2 * | 2/2022 | Inamasa | H05K 7/20181 |

* cited by examiner (A) OUTER BLADE (B) INNER BLADE (A)

(TOP VIEW)

(B)

(TOP VIEW)

(A)

(B)

(C)

WIND PRESSURE TYPE SHUTTER FOR OUTDOOR SWITCHBOARD

FIELD

The present disclosure relates to a wind pressure type shutter for an outdoor switchboard.

BACKGROUND

Generally, for a power conversion device for solar power generation which is installed outdoor, a system of actively taking in outside air and performing cooling using a heat sink or the like is adopted to increase price competitiveness and to increase device capacity.

It is important to prevent the entry of dust and water (such as from rain and snow) into the device while outside air is actively taken in. In recent years, torrential rain, typhoon, and snowstorm have been increasing and a risk of failure due to the entry of more water into the device than expected has also been increasing.

For achieving both the ensuring of the amount of ventilation and dustproofness/waterproofness, it is effective means to provide a shutter at an intake port or a discharge port.

For example, with regard to such a problem, PTL 1 discloses a technique of determining an abnormal weather using an external sensor and electrically controlling a shutter to close an intake port.

CITATION LIST

Patent Literature

[PTL 1] JP 2017-200298 A

SUMMARY

Technical Problem

However, in the technique in PTL 1, a control device to drive a sensor and a shutter is required, which carries a high cost and a high risk of failure. It is preferable that the problem be solved only by a simple structure that does not require a sensor and a control device.

Against such a problem, as illustrated in (A) of FIG. 9, for example, a wind pressure type shutter in which an intake-side blade 91 opens only inward and a discharge-side blade 92 opens only outward can be conceived. This wind pressure type shutter causes, when a cooling fan 90 is driven, an intake-side blade 91 to open inward due to a negative pressure and a discharge-side blade 92 to open outward by intake air being pushed out ((B) in FIG. 9).

However, as illustrated in (C) of FIG. 9, when a stronger outside wind than expected blows against an intake side, the intake-side blade 91 may open inward, which may cause the entry of water and dust to an inside. Thus, it cannot be said that measures against inclement weather is sufficient.

The wind pressure type shutter illustrated in FIG. 9 has a simple structure and is excellent in cost performance; however, since the intake-side blade 91 opens by being pushed by outside wind, the wind pressure type shutter cannot be placed on an intake side where the direction of entry of dust and water due to outside wind and the intake direction of the device are the same.

The present disclosure has been made to solve the above problem, and an object thereof is to provide a wind pressure type shutter for an outdoor switchboard that features excellent waterproofness and dustproofness in a storm and further features low cost and failure risk.

Solution to Problem

The first aspect relates to a wind pressure type shutter for an outdoor switchboard.

The outdoor switchboard has a flow path for discharging, from a discharge port, gas taken in from an intake port.

The wind pressure type shutter includes a first rotation shaft, a first flap, a second rotation shaft, and a second flap.

The first rotation shaft is horizontally arranged downstream of the intake port.

The first flap is rotatably hung on the first rotation shaft. The first flap closes the flow path in a vertical position. The first flap opens the flow path in a position in which the first flap has rotated from the vertical position.

The second rotation shaft is horizontally arranged downstream of the first flap.

The second flap is rotatably attached to the second rotation shaft. The second flap closes the flow path and prevents rotation of the first flap by an upstream-side end portion of the second flap in a horizontal position. The second flap opens the flow path in a position in which the second flap has rotated from the horizontal position.

When a negative pressure is generated downstream of the second flap, the second flap rotates to open the flow path and the upstream-side end portion is disengaged from the first flap, so that the first flap rotates toward a downstream side to open the flow path.

The second aspect further has the following feature in addition to the first aspect.

The center of gravity of the second flap is positioned closer to a side of the first flap than the second rotation shaft.

The third aspect further has the following feature in addition to the first or second aspect.

The second flap has an intake opening arranged closer to a side of the first flap than the second rotation shaft.

The fourth aspect further has the following.

The intake opening is covered by a dustproof filter.

The fifth aspect further has the following feature in addition to any one of the first to fourth aspects.

The outdoor switchboard has a fan that generates a negative pressure downstream of the second flap.

The sixth aspect further has the following feature in addition to any one of the first to fifth aspects.

An angle range in which the second flap can be rotated is less than 90 degrees from the horizontal position.

The seventh aspect further has the following feature in addition to any one of the first to sixth aspects.

The first flap is rotatable only in a downstream direction from the vertical position.

Advantageous Effects of Invention

The wind pressure type shutter according to the present disclosure features excellent waterproofness and dustproofness even when the outside wind is strong because an outer flap (first flap) on the intake side is locked by an inner flap (second flap) when the switchboard is not operating. In addition, the wind pressure type shutter is implemented with a simple structure, achieving low cost (manufacturing cost and maintenance cost) and low failure risk. The wind pressure type shutter is suitable for application to the intake portion of a power conversion device for solar power generation which is installed outdoors and does not operate during inclement weather.

DESCRIPTION OF EMBODIMENTS

Figure 1:
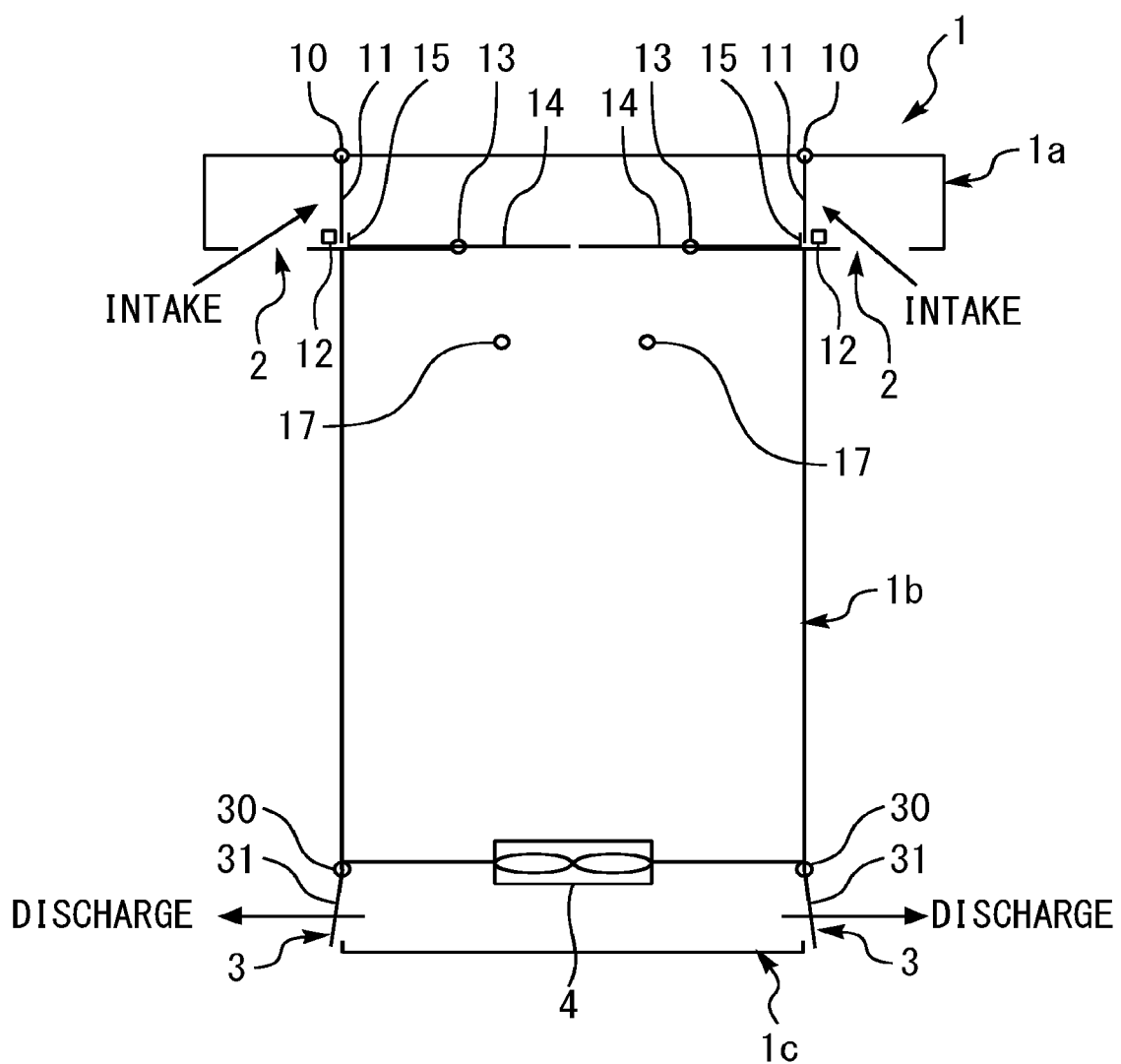
FIG. 1 is a diagram for describing a configuration example of an outdoor switchboard according to an embodiment.

Hereinafter, an embodiment of the present disclosure will be described in detail with reference to drawings. It should be noted that common elements in the drawings are denoted by the same reference signs to omit redundant explanations.

Embodiment

1. Outdoor Switchboard

FIG. 1 is a diagram for describing a configuration example of an outdoor switchboard according to an embodiment. The outdoor switchboard is, for example, a power conversion device for solar power generation which is installed outdoors.

A housing 1 of the outdoor switchboard consists of, in order from the top, a roof part 1a, an apparatus storage part 1b, and an underfloor part 1c. Intake ports 2 are formed on eaves of the roof part 1a so as to prevent the entry of rain and dust. In the apparatus storage part 1b, an unillustrated heat source (e.g., a power conversion device) and a cooling fan 4 for cooling the heat source are arranged. The cooling fan 4, which is installed between the apparatus storage part 1b and the underfloor part 1c, discharges gas within the apparatus storage part 1b to the underfloor part 1c. In the underfloor part 1c, discharge ports 3 are formed. On an upper portion of each discharge port 3, a third rotation shaft 30 is horizontally arranged. A discharge blade 31 is hung on the third rotation shaft 30 and is rotatable outward only.

The housing 1 has a flow path for discharging, from the discharge ports 3, gas taken in from the intake ports 2. On a flow path from the intake ports 2 of the roof part 1a to the apparatus storage part 1b, a wind pressure type shutter is arranged. On a flow path from the apparatus storage part 1b to the underfloor part 1c, a heat source, the cooling fan 4, and a power source (not illustrated) for supplying power to the heat source and the cooling fan 4 are arranged.

2. Configuration of Wind Pressure Type Shutter

Figure 2:
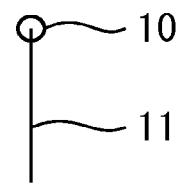
FIG. 2 is a side view of an outer blade and an inner blade according to the embodiment.
Figure 2:
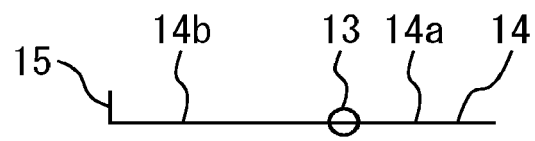

Next, the configuration of the wind pressure type shutter according to the present embodiment will be described with reference to FIG. 1 and FIG. 2. FIG. 2 is a diagram for describing basic components included in the wind pressure type shutter. The roof part 1a includes the wind pressure type shutter having a dual structure of outer blades 11 (first flaps) and inner blades 14 (second flaps).

(Outer Blades)

A first rotation shaft 10 is horizontally arranged downstream of each intake port 2. An outer blade 11 (first flap) is rotatably hung on the first rotation shaft 10. The outer blade 11 closes the flow path in a vertical position (still position) and opens the flow path in a state where the outer blade 11 has rotated from the vertical position. The outer blade 11 is adjusted to close the flow path in a windless condition. The outer blade 11 is a rectangular plate of metal or synthetic resin. A first rotation protector 12 is provided on the roof part 1a so as to prevent the outer blade 11 from rotating from the vertical position to an upstream side. The first rotation protector 12 can prevent the outer blade 11 from opening due to cross wind blowing upward.

(Inner Blades)

A second rotation shaft 13 is horizontally arranged downstream of each outer blade 11. The second rotation shaft 13 is placed at the substantially same height as that of a lower end of the outer blade 11 in a vertical state. An inner blade 14 is rotatably attached to the second rotation shaft 13. A portion on a downstream side with respect to the second rotation shaft 13 of the inner blade 14 is denoted by 14a and a portion on an upstream side by 14b. The center of gravity of the inner blade 14 is positioned on the upstream-side portion 14b. The center of gravity of the inner blade 14 is adjusted so that the inner blade 14 becomes stable in a horizontal position when the cooling fan 4 stops and the inner blade 14 rotates when the cooling fan 4 operates. The upstream-side portion 14b is supported by a bottom surface of the roof part 1a, when in a horizontal state. Below the downstream-side portion 14a, an opening is provided between the roof part 1a and the apparatus storage part 1b as a flow path.

An upstream-side end portion of each inner blade 14 (upstream-side portion 14b) has a stopper 15. The inner blade 14 closes the flow path between the roof part 1a and the apparatus storage part 1b when in a horizontal position. In addition, the inner blade 14 prevents the rotation of the outer blade 11 by the stopper 15 when in a horizontal position. The inner blade 14 opens the flow path in a position when the downstream-side portion 14a has rotated downward from the horizontal position. The inner blade 14 is a rectangular plate of metal or synthetic resin. A second rotation protector 17 is provided so that an angle range in which the inner blade 14 can be rotated is less than 90 degrees from the horizontal position. By limiting the angle range in which the inner blade 14 can be rotated, as described above, the inner blade 14 can be returned to the horizontal position due to self-weight when the cooling fan 4 stops.

Figure 3:
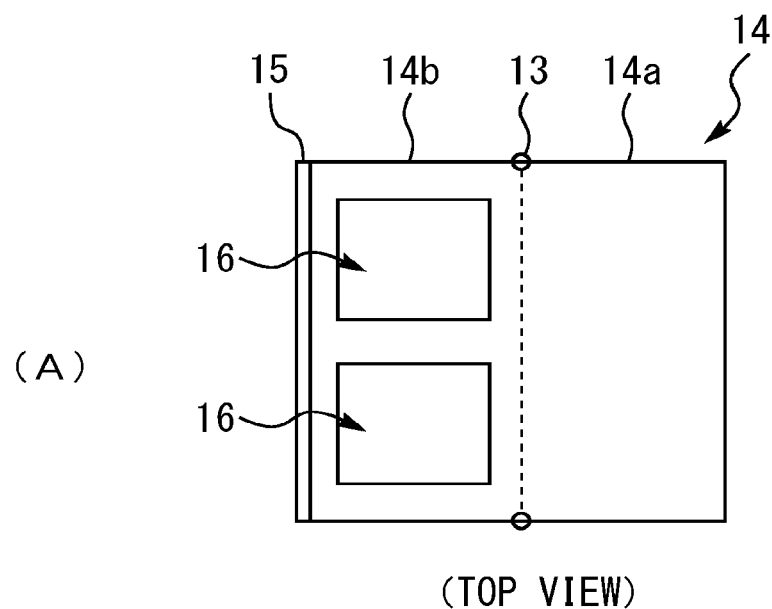
FIG. 3 is a top view of the inner blade according to the embodiment.
Figure 3:
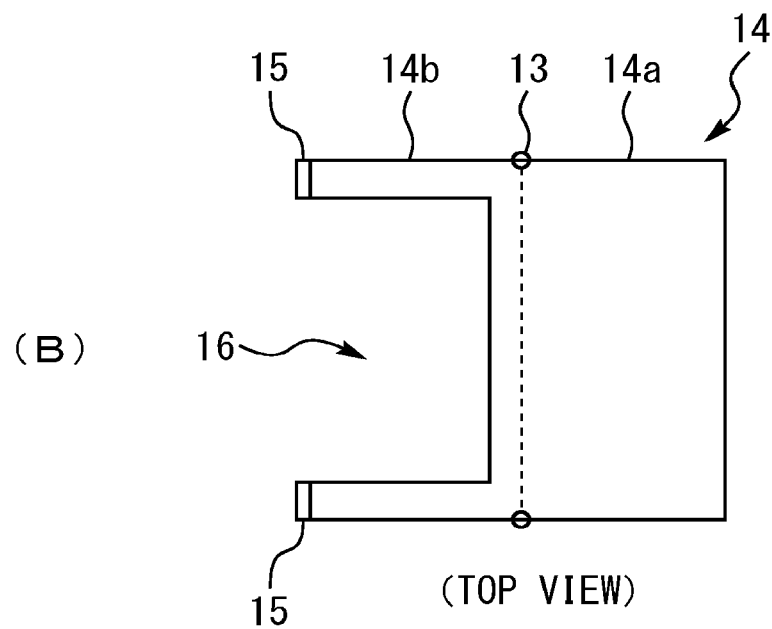

FIG. 3 is a top view that illustrates the inner blade 14. (A) of FIG. 3 illustrates one example of the inner blade 14. For making the upstream-side portion 14b function as part of the flow path, the upstream-side portion 14b has intake openings 16. (B) of FIG. 3 illustrates another example of the inner blade 14. As compared with (A) of FIG. 3, a larger intake opening 16 is arranged and the stopper 15 is positioned only at both end portions in the width direction.

In such a configuration, when the cooling fan 4 operates, a negative pressure is generated downstream of each inner blade 14. Specifically, the atmospheric pressure of a flow path of the apparatus storage part 1b becomes lower than a predetermined value as compared with the atmospheric pressure of a flow path of the roof part 1a. When a negative pressure is generated downstream of the inner blade 14, the inner blade 14 rotates to open the flow path and the stopper 15 is disengaged from the outer blade 11, so that the inner blade 14 rotates toward a downstream side to open the flow path.

3. Operation of Wind Pressure Type Shutter

Next, the operation of the wind pressure type shutter according to the operating state of the cooling fan 4 will be described.

Figure 4:
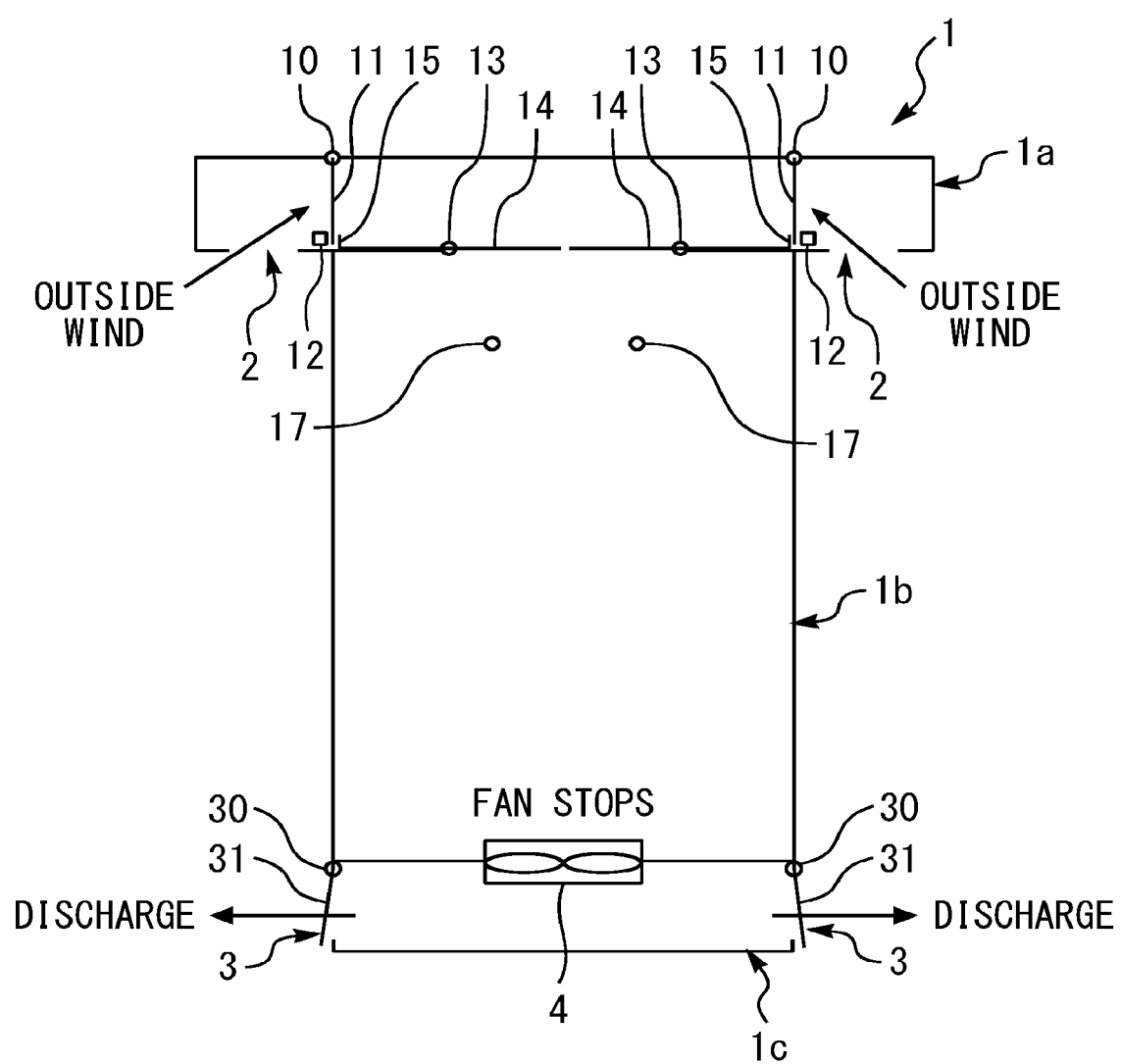
FIG. 4 is a diagram for describing an operation of a wind pressure type shutter according to the embodiment.

FIG. 4 is a diagram that illustrates the state of the wind pressure type shutter before the operation of the cooling fan 4 starts. When the fan stops, each inner blade 14 stands still in a horizontal position, closing the flow path. Each outer blade 11 stands still in a vertical position, closing the flow path. At this time, the rotation of the outer blade 11 toward the upstream side is prevented by the first rotation protector 12 and the rotation toward the downstream side is prevented by the stopper 15 that is the upstream-side end portion of the inner blade 14. Therefore, even when the outer blade 11 is pushed by a strong outside wind, the outer blade 11 can keep a closed state.

Figure 5:
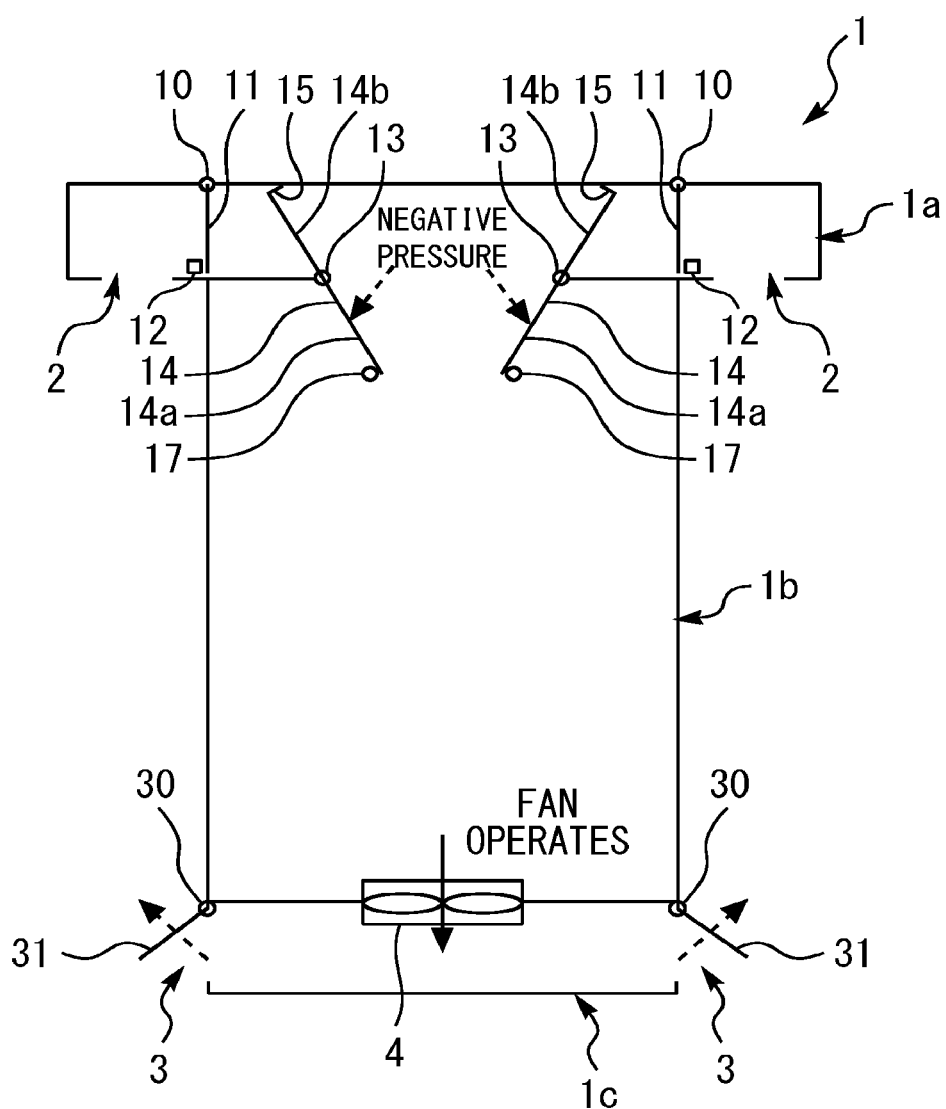
FIG. 5 is a diagram for describing the operation of the wind pressure type shutter according to the embodiment.

FIG. 5 is a diagram for describing the operation of the wind pressure type shutter after the cooling fan 4 starts operation. When the cooling fan 4 starts operation, the inside of the apparatus storage part 1b turns into a negative pressure state and a pressure difference causes each inner blade 14 to rotate in an opening direction. The inner blade 14 rotates until it comes into contact with the second rotation protector 17. At this time, with the rotation of the inner blade 14, the stopper 15 is disengaged from the outer blade 11.

Figure 6:
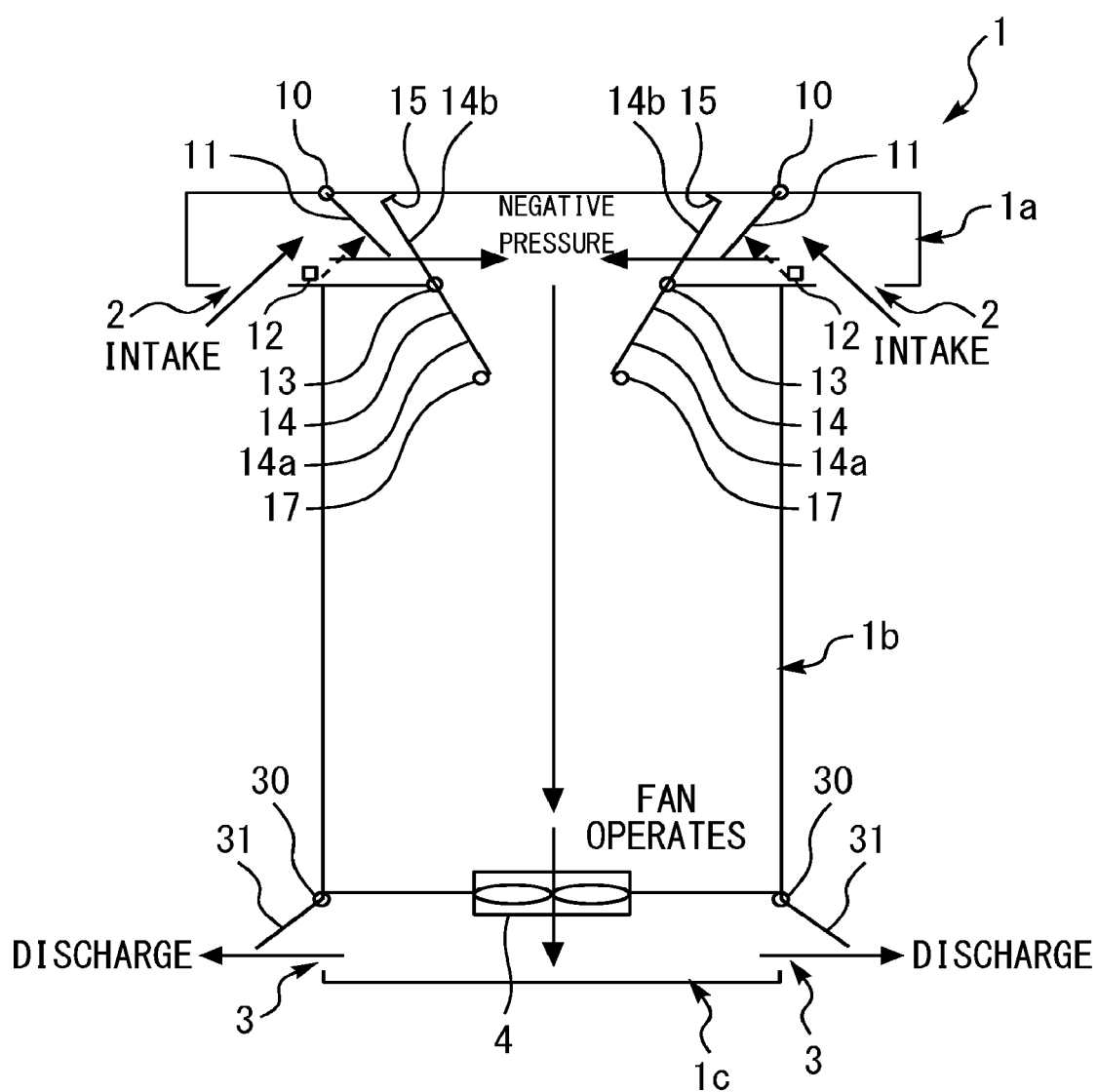
FIG. 6 is a diagram for describing the operation of the wind pressure type shutter according to the embodiment.

FIG. 6 is a diagram for describing the operation of the wind pressure type shutter after the cooling fan 4 starts operation. When the stopper 15 that is holding the outer blade 11 is disengaged, the outer blade 11 also rotates in an opening direction due to a pressure difference. This causes a flow path from each intake port 2 to each discharge port 3 to open, allowing an outside air to be taken into the inside of the switchboard. It should be noted that since the upstream-side portion 14b of each inner blade 14 has the intake opening 16 as illustrated in FIG. 3 described above, the inner blade 14 does not prevent ventilation in the state illustrated in FIG. 6.

Figure 7:
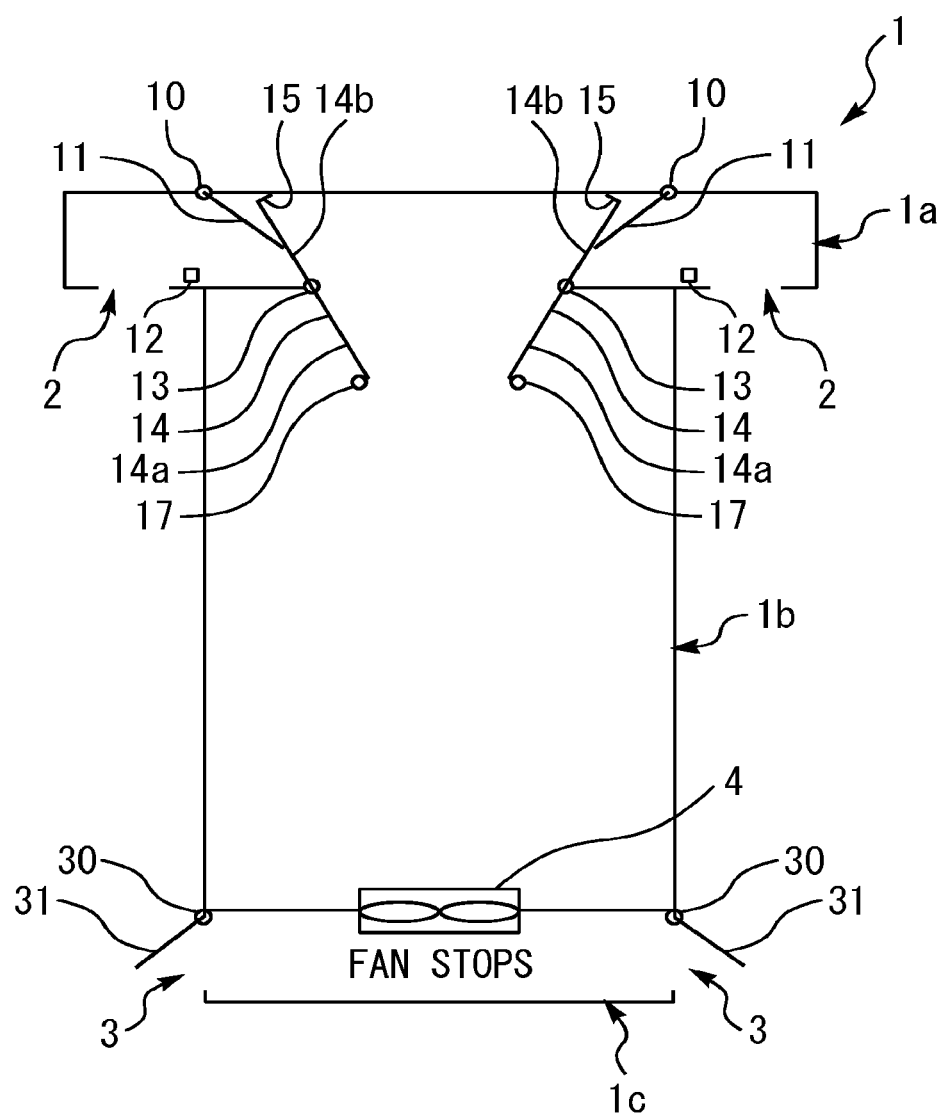
FIG. 7 is a diagram for describing the operation of the wind pressure type shutter according to the embodiment.
Figure 8:
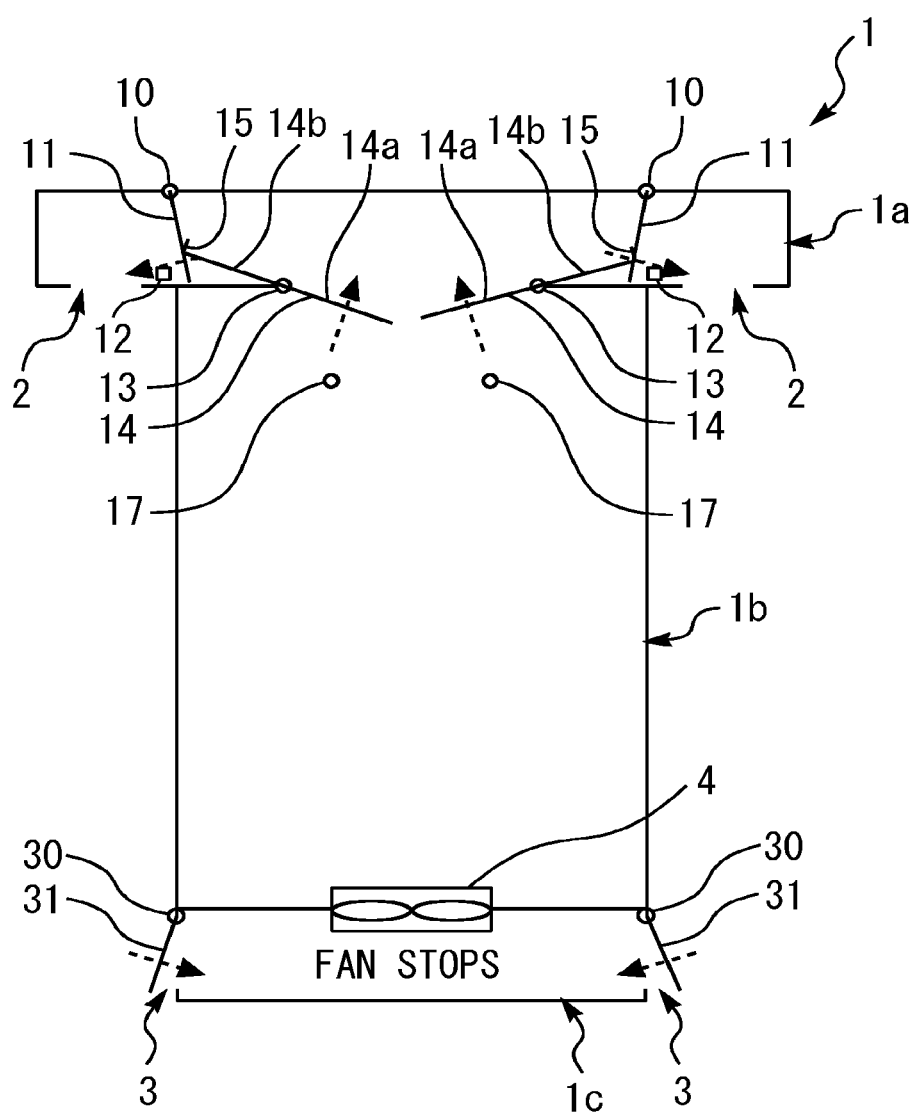
FIG. 8 is a diagram for describing the operation of the wind pressure type shutter according to the embodiment.
Figure 9:
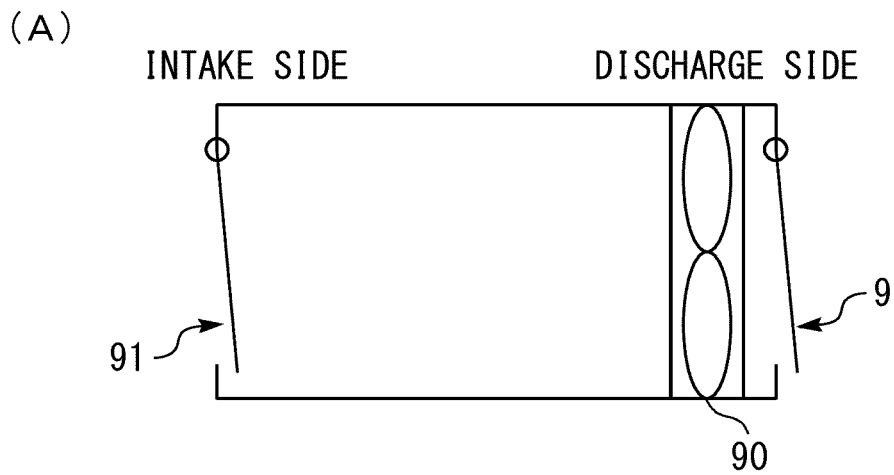
FIG. 9 is a diagram for describing a wind pressure type shutter for comparison.
Figure 9:
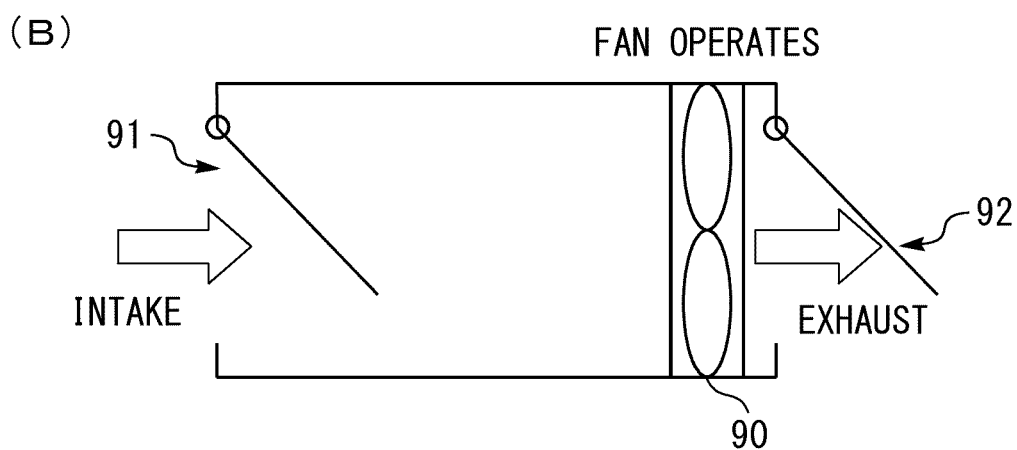
Figure 9:
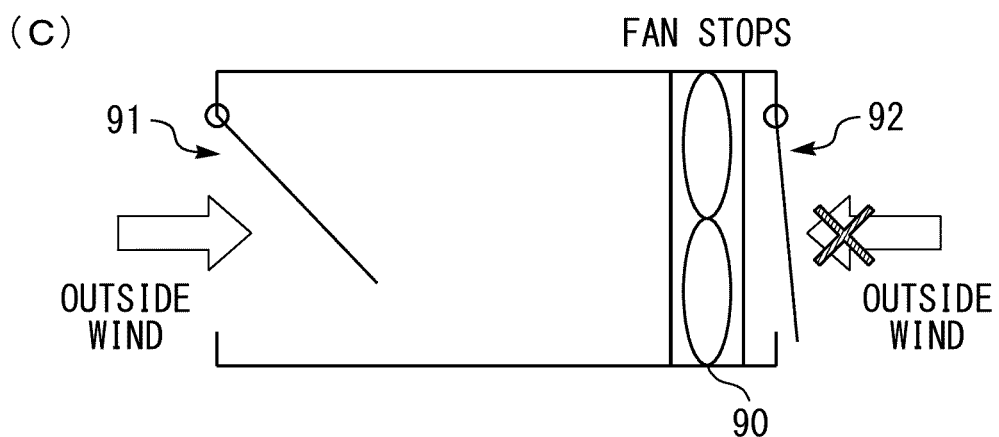

FIG. 7 and FIG. 8 are diagrams for describing the operation of the wind pressure type shutter when the cooling fan turns from an operating state to a stopped state. When the cooling fan 4 stops, the flow of wind within the housing 1 stops. The stop of the wind causes each inner blade 14 and each outer blade 11 to rotate in a closing direction due to self-weight. Since the stopper 15 of the inner blade 14 pushes the outer blade 11, not only the inner blade 14 is closed.

4. Effect

As described above, the wind pressure type shutter having a dual structure according to the present embodiment causes the outer blade 11 on an intake side to be locked by the stopper 15 of the inner blade 14 when the fan stops, and thereby allows dust and water to be prevented from entering even when outside wind is strong, thus exhibiting excellent waterproofness and dustproofness. In addition, the wind pressure type shutter according to the present embodiment is implemented with a simple structure that is coordinated with the operation of the fan, achieving low cost (manufacturing cost and maintenance cost) and low failure risk. Furthermore, commonly, in implementing measures against rainstorm and snowstorm within the inside of a device, it is required to improve internal waterproofness; however, the wind pressure type shutter can cope with them only by measures at the intake portion and therefore, achieves great cost-effectiveness.

The wind pressure type shutter according to the present embodiment can prevent, under an out-of-specification environmental condition, the entry of more dust and water than the allowable amounts by stopping the switchboard (fan). The power conversion device for solar power generation operates on a clear day and stops in bad weather, in most cases, and is therefore preferable as an application target of the wind pressure type shutter according to the present embodiment.

5. Modification

The inner blade 14 described above includes the intake opening 16. The intake opening 16 may be covered by a dustproof filter. With a dustproof filter, environmental resistance can be enhanced.

Although the embodiment according to the present disclosure has been described above, the present disclosure is not limited to the above embodiment and can be implemented modified in various ways without departing from the spirit of the present disclosure. When numbers such as the number, quantity, volume, or range of elements are referred to in the embodiment described above, the present disclosure is not limited by the numbers referred to except where especially explicitly specified and where clearly specified to the numbers in principle. In addition, structures and the like that are described in the embodiment described above are not necessarily required for the present disclosure except where especially explicitly specified and where clearly specified thereto in principle.

REFERENCE SIGNS LIST

1 Housing
1a Roof part
1b Apparatus storage part
1c Underfloor part
2 Intake port
3 Discharge port
4 Cooling fan
10 First rotation shaft
11 Outer blade
12 First rotation protector
13 Second rotation shaft
14 Inner blade
14a Downstream-side portion
14b Upstream-side portion
15 Stopper
16 Intake opening
17 Second rotation protector
30 Third rotation shaft
31 Discharge blade
90 Cooling fan
91 Intake-side blade
92 Discharge-side blade

The invention claimed is:

1. A wind pressure type shutter for an outdoor switchboard having a flow path for discharging, from a discharge port, gas taken in from an intake port, the wind pressure type shutter comprising:
a first rotation shaft that is horizontally arranged downstream of the intake port;
a first flap that is rotatably hung on the first rotation shaft, the first flap closing the flow path in a vertical position and opening the flow path in a position in which the first flap has rotated from the vertical position;

a second rotation shaft that is horizontally arranged downstream of the first flap; and a second flap that is rotatably attached to the second rotation shaft, the second flap, in a horizontal position, closing the flow path and preventing rotation of the first flap by an upstream-side end portion of the second flap, and in a position in which the second flap has rotated from the horizontal position, opening the flow path, wherein when a negative pressure is generated downstream of the second flap, the second flap rotates to open the flow path and the upstream-side end portion is disengaged from the first flap, so that the first flap rotates toward a downstream side to open the flow path.

2. The wind pressure type shutter for the outdoor switchboard according to claim 1, wherein a center of gravity of the second flap is positioned closer to a side of the first flap than the second rotation shaft.

3. The wind pressure type shutter for the outdoor switchboard according to claim 2, wherein the second flap has an intake opening arranged closer to a side of the first flap than the second rotation shaft.

4. The wind pressure type shutter for the outdoor switchboard according to claim 2, wherein the outdoor switchboard has a fan that generates the negative pressure downstream of the second flap.

5. The wind pressure type shutter for the outdoor switchboard according to claim 2, wherein an angle range in which the second flap can be rotated is less than 90 degrees from the horizontal position.

6. The wind pressure type shutter for the outdoor switchboard according to claim 2, wherein the first flap is rotatable only in a downstream direction from the vertical position.

7. The wind pressure type shutter for the outdoor switchboard according to claim 1, wherein the second flap has an intake opening arranged closer to a side of the first flap than the second rotation shaft.

8. The wind pressure type shutter for the outdoor switchboard according to claim 7, wherein the intake opening is covered by a dustproof filter.

9. The wind pressure type shutter for the outdoor switchboard according to claim 8, wherein the outdoor switchboard has a fan that generates the negative pressure downstream of the second flap.

10. The wind pressure type shutter for the outdoor switchboard according to claim 8, wherein an angle range in which the second flap can be rotated is less than 90 degrees from the horizontal position.

11. The wind pressure type shutter for the outdoor switchboard according to claim 8, wherein the first flap is rotatable only in a downstream direction from the vertical position.

12. The wind pressure type shutter for the outdoor switchboard according to claim 7, wherein the outdoor switchboard has a fan that generates the negative pressure downstream of the second flap.

13. The wind pressure type shutter for the outdoor switchboard according to claim 7, wherein an angle range in which the second flap can be rotated is less than 90 degrees from the horizontal position.

14. The wind pressure type shutter for the outdoor switchboard according to claim 7, wherein the first flap is rotatable only in a downstream direction from the vertical position.

15. The wind pressure type shutter for the outdoor switchboard according to claim 1, wherein the outdoor switchboard has a fan that generates the negative pressure downstream of the second flap.

16. The wind pressure type shutter for the outdoor switchboard according to claim 15, wherein an angle range in which the second flap can be rotated is less than 90 degrees from the horizontal position.

17. The wind pressure type shutter for the outdoor switchboard according to claim 15, wherein the first flap is rotatable only in a downstream direction from the vertical position.

18. The wind pressure type shutter for the outdoor switchboard according to claim 1, wherein an angle range in which the second flap can be rotated is less than 90 degrees from the horizontal position.

19. The wind pressure type shutter for the outdoor switchboard according to claim 18, wherein the first flap is rotatable only in a downstream direction from the vertical position.

20. The wind pressure type shutter for the outdoor switchboard according to claim 1, wherein the first flap is rotatable only in a downstream direction from the vertical position.

* * * * *